(12) United States Patent
Li

(10) Patent No.: US 10,510,899 B2
(45) Date of Patent: *Dec. 17, 2019

(54) THIN FILM TRANSISTOR, THIN FILM TRANSISTOR MANUFACTURING METHOD AND LIQUID CRYSTAL DISPLAY PANEL

(71) Applicant: Wuhan China Star Optoelectronics Semiconductor Display Technology Co., Ltd., Wuhan, Hubei (CN)

(72) Inventor: Songshan Li, Guangdong (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 15/737,305

(22) PCT Filed: Oct. 20, 2017

(86) PCT No.: PCT/CN2017/106975
§ 371 (c)(1),
(2) Date: Dec. 17, 2017

(87) PCT Pub. No.: WO2019/029009
PCT Pub. Date: Feb. 14, 2019

(65) Prior Publication Data
US 2019/0043995 A1    Feb. 7, 2019

(30) Foreign Application Priority Data

Aug. 7, 2017  (CN) .......................... 2017 1 0669995

(51) Int. Cl.
*H01L 29/786*   (2006.01)
*H01L 29/417*   (2006.01)
(Continued)

(52) U.S. Cl.
CPC .. *H01L 29/78618* (2013.01); *H01L 21/02532* (2013.01); *H01L 21/02672* (2013.01);
(Continued)

(58) Field of Classification Search
CPC ......... H01L 29/78618; H01L 21/02672; H01L 21/324; H01L 29/458; H01L 29/41733;
(Continued)

(56) References Cited

U.S. PATENT DOCUMENTS 8,049,255 B2  11/2011  Takeshi et al.
8,133,773 B2   3/2012  Shih et al.
(Continued)

FOREIGN PATENT DOCUMENTS

CN          101409308 A     4/2009

*Primary Examiner* — Thanh Y. Tran
(74) *Attorney, Agent, or Firm* — Andrew C. Cheng

(57) ABSTRACT

The present invention discloses a thin film transistor, a method for manufacturing a thin film transistor, and a liquid crystal display panel. The thin film transistor includes a substrate, a gate layer disposed on the substrate, an insulating layer covering the gate layer, a semiconductor layer disposed on the insulating layer; a conductor layer disposed on the semiconductor layer and a source and drain layer provided on the conductor layer and the insulating layer, and a conductor layer or a conductive spacer is provided between the source and drain layer and the semiconductor layer, and the passivation layer is provided on the insulating layer, the source and drain layer, and the semiconductor layer. The leakage current of the thin film transistor of the invention is small, and the quality of the thin film transistor is high.

6 Claims, 6 Drawing Sheets

(51) Int. Cl.
  *H01L 29/45* (2006.01)
  *H01L 29/66* (2006.01)
  *H01L 21/02* (2006.01)
  *H01L 21/265* (2006.01)
  *H01L 21/324* (2006.01)

(52) U.S. Cl.
  CPC ...... *H01L 21/26513* (2013.01); *H01L 21/324* (2013.01); *H01L 29/41733* (2013.01); *H01L 29/458* (2013.01); *H01L 29/66765* (2013.01); *H01L 29/78696* (2013.01); *H01L 21/0262* (2013.01); *H01L 21/02592* (2013.01)

(58) Field of Classification Search
  CPC ......... H01L 21/26513; H01L 21/02592; H01L 21/0262
  See application file for complete search history.

(56) References Cited

U.S. PATENT DOCUMENTS

| | | |
|---|---|---|
| 8,269,217 B2 | 9/2012 | Arai et al. |
| 2017/0229571 A1* | 8/2017 | Choi .................. H01L 21/0226 |

\* cited by examiner

THIN FILM TRANSISTOR, THIN FILM TRANSISTOR MANUFACTURING METHOD AND LIQUID CRYSTAL DISPLAY PANEL

FIELD OF THE DISCLOSURE

The present invention relates to a display technology, and more particularly, to a thin film transistor, a method of manufacturing a thin film transistor and a liquid crystal display panel.

BACKGROUND

A thin film transistor (Thin Film Transistor, referred to as TFT) are widely used in a liquid crystal display device (Liquid Crystal Display, referred to as LCD) and an active matrix driving type organic electroluminescent display device (Active Matrix Organic Light-Emitting Diode, referred AMOLED). As a result, thin film transistors affect the development of the display industry. However, in the conventional thin film transistor manufacturing method, formation of the thin film transistor has a problem that the leakage current is too large, and the leakage current influences the characteristics of the thin film transistor.

SUMMARY

The embodiment of the present invention provides a thin film transistor, a method for manufacturing a thin film transistor and a liquid crystal display panel to solve the problem that the leakage current of the thin film transistor is excessively large.

In order to solve the above technical problems, a technical aspect of the present invention is to provide a thin film transistor including a substrate, a gate layer disposed on the substrate; an insulating layer covering the gate layer; a semiconductor layer disposed on the insulating layer; a conductor layer provided on the semiconductor layer, a source and drain layer disposed on the conductor layer and insulting layer; and a conductor layer or a conductive spacer is provided between the source and drain layer and the semiconductor layer; a passivation layer disposed on the insulating layer, the source and drain layers, and the semiconductor layer.

According to another aspect of the present invention, a method for manufacturing a thin film transistor is provided. The method comprises: a substrate; a gate layer and an insulating layer formed sequentially on the substrate, the insulating layer covering the gate layer; a semiconductor layer and a conductor layer are sequentially formed on the insulating layer; a source and drain layer is formed on the conductor layer and the insulating layer, and further a conductor layer or a conductive spacer is provided between the source and drain layers and the semiconductor layer. Also, a conductive spacer is provided between the source and drain layer and the semiconductor layer, a conductive spacer is provided on the insulating layer before the source and drain layers are formed, and a passivation layer is provided on the insulating layer, the source and drain layer, and the semiconductor layer.

According to still another aspect of the present invention, a liquid crystal display panel comprises a thin film transistor including a substrate, a gate layer provided on the substrate, an insulating layer, covering the gate layer; a semiconductor layer, provided on the insulating layer; a conductor layer, disposed on the semiconductor layer; the semiconductor layer having a channel region, and the channel layer dividing the semiconductor layer into left and right portions; the conductor layer being formed on the left and right portion of the semiconductor layer, to form two-island structure. A source and drain layer provided on the conductor layer and the insulating layer, and a conductor layer or a conductive spacer is provided between the source and drain layer and the semiconductor layer; a passivation layer is provided on an insulating layer, a source drain layer and a semiconductor layer. The gate layer and the source and drain layer are metal materials; the insulating layer, the insulating spacer layer and the passivation layer are all insulating materials.

In the invention, a gate layer and an insulating layer are sequentially formed on the substrate, the insulating layer is covered with the gate layer, the semiconductor layer and the conductor layer are sequentially formed on the insulating layer, the source and drain layers are formed on the conductor layer and the insulating layer, and a conductor layer or a conductive spacer is provided between the source and drain layer and the semiconductor layer. If the conductive spacer is provided between the source and drain layers and the semiconductor layer, the conductive spacer is provided on the insulating layer before the source and drain layer are formed; A passivation layer is provided on the insulating layer, the source and drain layer and the semiconductor layer. and the conductor layer and the conductive spacer is disposed between the source and drain layer and the semiconductor layer. They can protect the source and drain layer and the semiconductor layer from direct contact. It is possible to reduce the effect of the leakage current and improve the characteristics of the thin film transistor.

BRIEF DESCRIPTION OF THE DRAWINGS

In order to more clearly illustrate the embodiments or the prior art technical solutions embodiment of the present invention, it will implement the following figures for the cases described in the prior art or the need to use a simple introduction. Apparently, the following description the drawings are only some embodiments of the present invention, those of ordinary skill in speaking, without creative efforts of the premise, but also can derive other drawings from these drawings.

DETAILED DESCRIPTION OF PREFERRED EMBODIMENTS

The embodiments described in the embodiments of the present invention will now be described in conjunction with the accompanying drawings in the embodiments of the present invention, and it will be apparent that the described embodiments are only part of the embodiments of the invention and are not intended to be exhaustive. All other embodiments obtained by those of ordinary skill in the art without making creative work are within the scope of the present invention, based on embodiments in the present invention.

In the description of the present invention, the meaning of "plural" is at least two, such as two, three, etc., unless other specific definition. In addition, the terms "comprising" and "having"; and any variations thereof are intended to cover non-exclusive inclusion. For example, a process, method, system, product, or device that includes a series of steps or units, is not limited to the steps or units listed, but optionally also includes non-listing steps or units, or alternatively comprises other inherent steps or units to these processes, methods, products, or equipment.

Referred to herein, "an embodiment" means that a particular feature of the described embodiments, structures or characteristics may comprise at least one embodiment of the present invention. Various places in the specification are not necessarily all appear phrase referring to the same embodiment, nor are separate or alternative embodiments mutually exclusive of other embodiments of the embodiments. Those skilled in the art implicitly and explicitly understood that the embodiments described herein may be combined with other embodiments.

Figure 1:
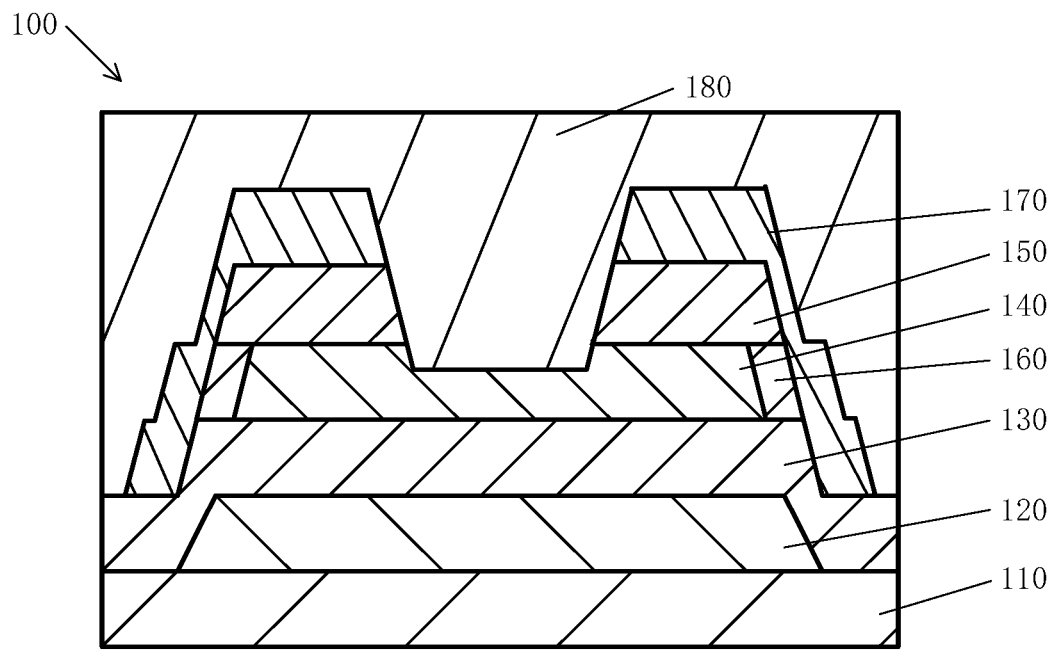
FIG. 1 is a schematic view of an embodiment of a thin film transistor according to the present invention.
Figure 2:
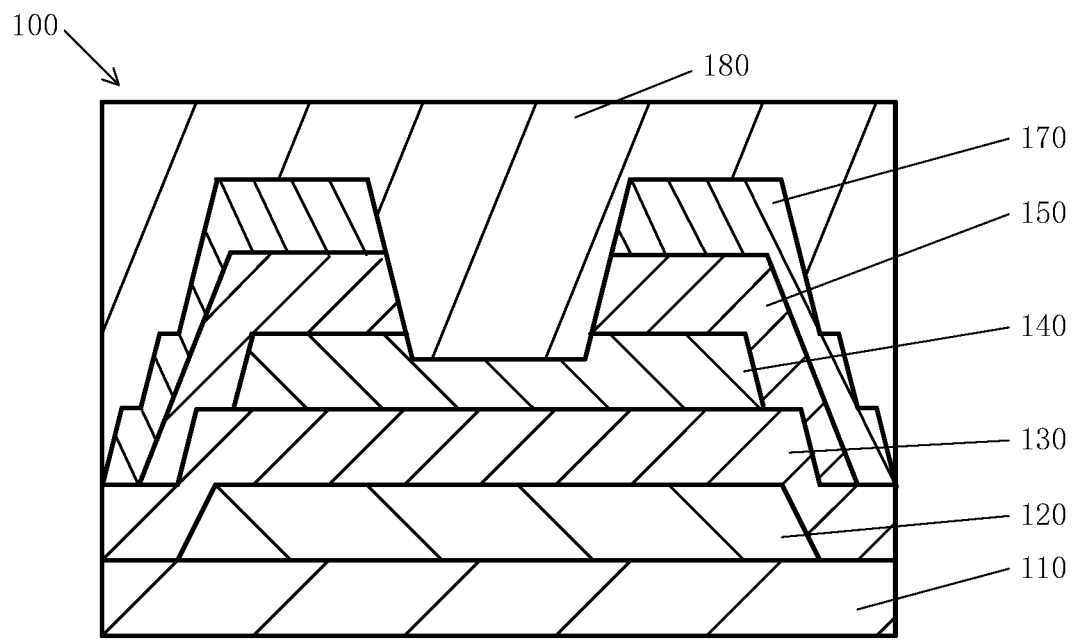
FIG. 2 is a schematic structural view of another embodiment of the thin film transistor of the present invention.

Please refer to FIG. 1 and FIG. 2. FIG. 1 is a structural diagram of a thin film transistor according to the present invention. FIG. 2 is a schematic view of a thin film transistor of another embodiment of the present invention.

In the embodiment of FIGS. 1 and 2, the difference between the thin film transistors is only the difference shape of the conductor layer and the presence or absence of the conductive spacers. Therefore, embodiments of FIGS. 1 and 2 are both denoted by the same reference numerals.

The thin film transistor 100 includes a substrate 110, a gate layer 120, an insulating layer 130, a semiconductor layer 140, a conductor layer 150, a source and drain layer 170, and a passivation layer 180. The one embodiment still comprises a conductive spacer 160.

The thin film transistor 100 is a laminated structure, and the layers are sequentially formed on the substrate 110, and the substrate 110 may be a glass substrate. The gate layer 120 is formed on the substrate 110, and the insulating layer 130 covers the gate layer 120. In this embodiment, the thin film transistor 100 is a bottom gate structure.

The semiconductor layer 140 as a thin film transistor active layer 100 is formed on the insulating layer 130; a conductor layer 150 is formed on the conductive semiconductor layer 140 so as to connect the source and drain layers 170. The current is formed between the source and drain layers 170 via the conducive layer 150 and then through the semiconductor layer 140. Compared to the source and drain layer 170 directly connected to the semiconductor layer 140, the conductor layer 150 in the embodiment has smaller resistance to reduce the leakage current situation between source and drain layer 140 and the semiconductor layer 170.

In the present embodiment, the conductor layer 150 or the conductive spacer 160 is formed on the insulating layer 130. The conductor layer 150 or the conductive spacer 160 is disposed in the same layer as the semiconductor layer 140, and the source and drain layer 170 is formed on the conductor layer 150. The conductive spacer 160 is located between the semiconductor layer 140 and the source and drain layer 170.

In an embodiment, the conductor layer 150 or the conductive spacer 160 is provided between the semiconductor layer 140 and the source and drain layer 170, i.e. there is no direct contact connection between the semiconductor 140 and the source and drain layer 170 so as to effectively reduce the leakage current between the semiconductor layer 140 and the source and the drain layer 170.

The semiconductor layer 140 has a channel region 141. The channel region 141 is divided into left and right portions of the semiconductor layer 140. The conductor layer 150 is formed on the left and right portions of the semiconductor layer 140, and a two-islands structure is formed. The source and drain layers 170 formed on the two-island structure of the conductor layer 150 are also divided into source and drain electrodes.

The passivation layer 180 is formed on the source and drain layer 170 and the semiconductor layer 140. It is specifically formed on the channel region 141 of the semiconductor 140 and is formed between the two-island structure of the conductor layer 150.

In the above-mentioned structure of thin film transistor 100, the insulating layer 130 and the passivation layer 180 are both insulating materials and may be silicon oxide or silicon nitride. The gate layer 120 and the source and drain layer 170 are metallic materials, which may be metal materials such as molybdenum and aluminum, and may be a combination of molybdenum-aluminum-molybdenum metal materials. The semiconductor layer 140 may be polysilicon, and the conductor layer 150 and the conductive spacers 160 may be P+ conductor layers formed of polysilicon doped with B ions.

In addition, the conductor layer 150 or the conductive spacer 160 may be provided between the semiconductor layer 140 and the source and drain layer 170 in the present embodiment. For example, the two modes are shown in FIGS. 1 and 2.

In FIG. 1, the conductive spacer 160 is formed on the side surface portion of the semiconductor layer 140, so that the source and drain layer 170 is disposed between the conductive spacer 160 and the portion of the semiconductor layer 140. In FIG. 2, the conductor layer 150 covers the semiconductor layer 140, so that the conductor layer 150 is disposed between the source and drain layer 170 and the semiconductor layer 140, and is also formed on the side surface of the semiconductor layer 140 on the insulating layer 130.

In the above embodiment, the conductive spacers or the conductor layers are located between the source and drain layers and the semiconductor layer, which can block the direct contact between the source and drain layer and the semiconductor layer so as to reduce the leakage current. Thereby, the performance of the thin film transistor is improved.

The present invention comprises a thin film transistor including a substrate, a gate layer disposed on the substrate, and an insulating layer covering the gate layer. A semiconductor layer is disposed on the insulating layer. A conductor layer is disposed on the semiconductor layer. A source and drain layer is provided on the conductor layer and the insulating layer. A conductor layer or conductive spacer is provided between the source and drain layer and the semiconductor layer; A passivation layer is disposed on the insulting layer, the source and drain layer and the semiconductor layer so as to reduce the path of leakage. There is an effect of reducing the leakage current.

Figure 3:
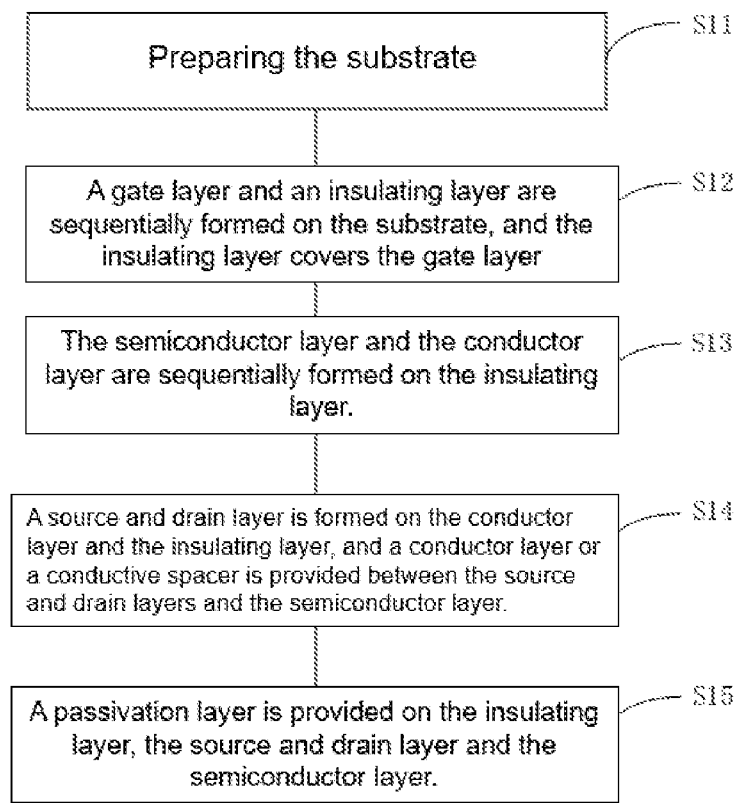
FIG. 3 is a schematic flow diagram of an embodiment of a method for manufacturing a thin film transistor of the present invention.

In order to obtain the thin film transistor described above, the present invention also provides a method for manufacturing a thin film transistor. Referring to FIG. 3. FIG. 3 is a schematic flow diagram of an embodiment of a method for manufacturing a thin film transistor of the present invention. In the present embodiment, the method of manufacturing the thin film transistor may include the steps of:

S11: Preparing the substrate.

A substrate for preparing a thin film transistor is prepared, and the substrate may be a glass substrate.

S12: A gate layer and an insulating layer are sequentially formed on the substrate, and the insulating layer covers the gate layer.

In this step S12, a layer of metal is deposited on the glass substrate prepared in the above-described step S11 to form a gate layer, and the gate layer is the metal material, molybdenum, in the present embodiment. And it should be acceptable to use another metal material in other embodiments. And then an insulating layer is provided on the gate layer which has been provided. The insulating layer is covered on the gate layer, i.e. the gate layer is formed between the substrate and the insulating layer. The material of the insulating layer in the embodiment is silicon oxide. In other embodiments, silicon nitride or other material capable of achieving the purpose of insulation can be used. The glass substrate formed in this step will be used in the following step S13.

S13: The semiconductor layer and the conductor layer are sequentially formed on the insulating layer.

In this step S13, the semiconductor layer and the conductor layer are further provided on the glass substrate obtained in the above-mentioned step S12. Specifically, an amorphous silicon is deposited on the upper surface of the insulating layer and then patterned by a process. A layer of conductive material is deposited and then crystallized by a process to form a semiconductor layer and a conductor layer. The semiconductor layer is formed on the adjacent side of the insulating layer. The conductor layer is formed on the far side of the insulating layer, i.e., the insulating layer is between the semiconductor layer and gate layer and the semiconductor layer is between the insulating layer and conductor layer.

Figure 4:
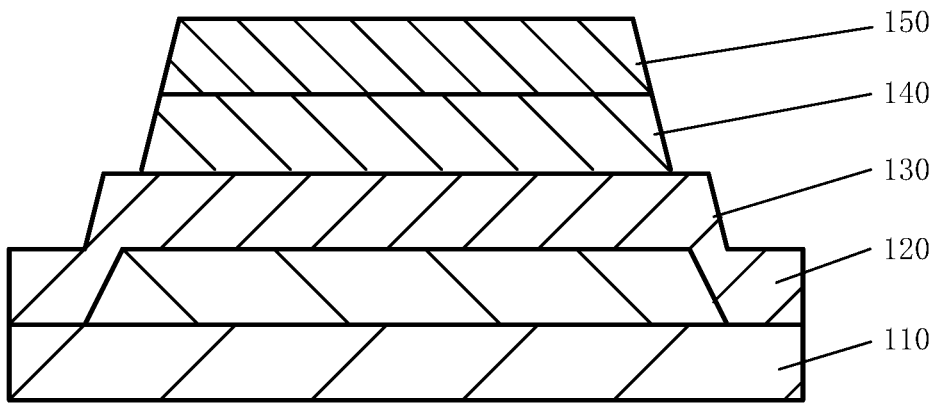
FIG. 4 is a schematic structural view of the substrate after step S13 of the method of manufacturing the thin film transistor shown in FIG. 3.

FIG. 4 can be understood in conjunction with the above-described steps. FIG. 4 is a schematic view of a substrate structure after the step S13 of the method of manufacturing a thin film transistor in FIG. 3. FIG. 4 shows a glass substrate 110, a gate layer 120 and an insulating layer 130, a gate layer 120 formed on the substrate 110, a gate insulating layer 130 covering the gate layer 120, a semiconductor layer 140 is formed on the insulating layer 130, a conductor layer 150 is formed on the semiconductor layer 140.

S14: A source and drain layer is formed on the conductor layer and the insulating layer, and a conductor layer or a conductive spacer is provided between the source and drain layer and the semiconductor layer.

In this step S14, a conductor layer or a conductive spacer may be provided between the source drain layer and the semiconductor layer.

In the case that the conductor layer is provided between the source and drain layer and the semiconductor layer, the conductor layer formed in step S13 is covered with the semiconductor layer so that the conductor layer separates between the source and drain layers formed in the step S14 and the semiconductor layer.

In the case where the conductive spacers are provided between the source and drain layer and the semiconductor layer, and the conductive spacers are provided on the insulating layer before the step S14. The conductive spacers are arranged in the same layer as the semiconductor layer so that the source and drain layers and the semiconductor layers formed in the step S14 are spaced by the conductive spacers.

S15: A passivation layer is provided on the insulating layer, the source and drain layer and the semiconductor layer.

There are two cases which conductor layer or conductive spacers in the step S14. It results in two kinds of thin film transistor having different shape. The two kinds of thin film transistors can be referred as shown FIG. 1 and FIG. 2. FIG. 1 is the case of the conductive spacer and FIG. 2 is the case of the conductor layer.

After forming the source and drain layer in step S14, the conductor layer is patterned to form a channel, and the conductor layer is two-island structure. The passivation layer formed in this step S15 is formed on the semiconductor layer, i.e., in the channel.

The thin film transistor of the present embodiment includes a preparation substrate; a gate layer and an insulating layer are sequentially formed on the substrate, and the insulating layer is covered with the gate layer; the semiconductor layer and the conductor layer are sequentially formed on the insulating layer; and a conductor layer or a conductive spacer is provided at both ends of the semiconductor layer; a drain and source layer is formed on the conductor layer and insulating layer. A passivation layer is provided on the insulating layer, the source and drain layer and the semiconductor layer. Because the source and drain layers are blocked by the conductor layer or the conductive spacer, and cannot contact the semiconductor layer. It can have the effect of reducing the leakage current and improving the characteristics of the thin film transistor.

Figure 5:
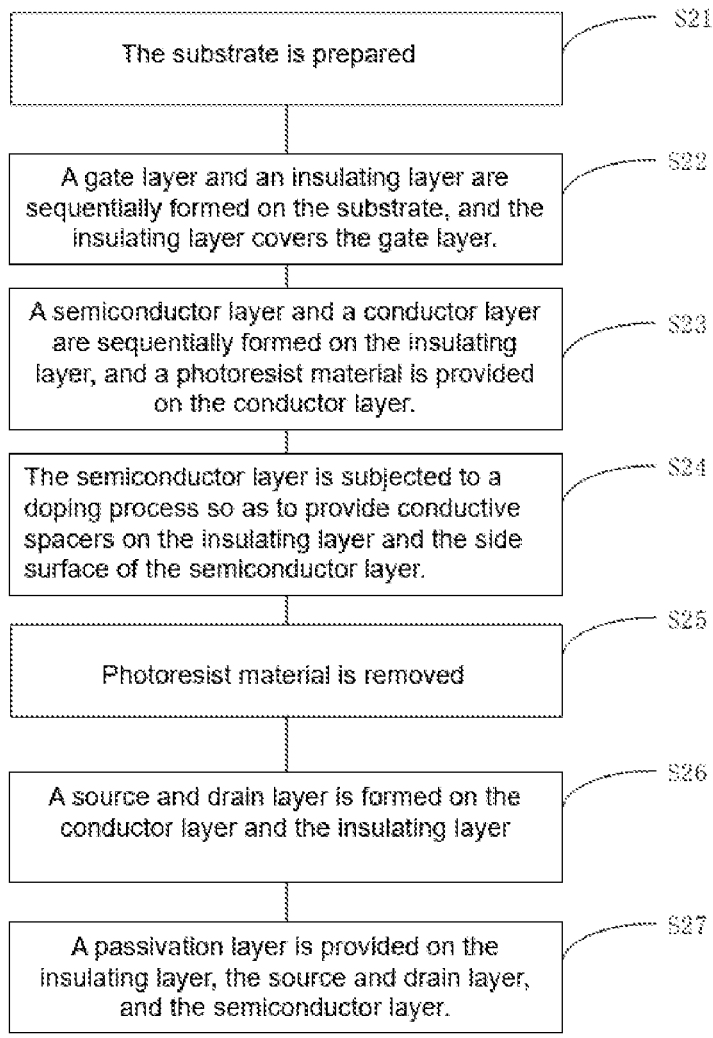
FIG. 5 is a schematic flow diagram of another embodiment of the method of manufacturing a thin film transistor of the present invention.

Refer to FIG. 5. FIG. 5 is a schematic flow diagram of another method of the present invention for manufacturing a thin film transistor according to embodiments. In the present embodiment, a method of manufacturing a thin film transistor may comprise the following steps.

S21: The substrate is prepared.

S22: A gate layer and an insulating layer are sequentially formed on the substrate, and the insulating layer covers the gate layer.

Steps S21-S22 are similar to steps S11-S12. In addition, in this step S22, a gate layer and an insulating layer are provided on the glass substrate, and specifically, a layer of metal is deposited on a glass substrate by PVD (Physical Vapor Deposition) technique and is patterned to form a gate layer. The metal material forming the gate layer in the present embodiment is molybdenum, and other metal materials may be used in other embodiments. And then, the insulating layer is formed on the gate layer by PECVD (Plasma Enhanced Chemical Vapor Deposition). The gate layer is formed between the glass substrate and the insulating layer. In this embodiment, the material of the insulating layer is silicon oxide, and in other embodiments, the insulating layer may also be silicon nitride or other materials capable of achieving insulation.

S23: A semiconductor layer and a conductor layer are sequentially formed on the insulating layer, and a photoresist material is provided on the conductor layer.

In this step S23, the semiconductor layer and the conductor layer are further provided on the glass substrate obtained in the above step S22, and specifically, the following steps are included.

S231: An amorphous silicon layer is formed on the insulating layer.

An amorphous silicon material is deposited on the insulating layer using the PECVD technology, and then the amorphous silicon is patterned by exposure etching to obtain an amorphous silicon layer.

S232: A conductor material is deposited on the amorphous silicon layer.

A patterned conductor layer material is deposited by PECVD on the amorphous silicon layer. A small amount of diborane is added by PECVD deposition gas. The amount of diborane is added according to actual operation, such as 0.5 ml, 1 ml, 5 ml, 10 ml, etc. The present embodiment adds the range of 10 ml, so that the deposited conductor material contains boron ions.

S233: The amorphous silicon layer is subjected to a crystallization treatment to obtain a polysilicon layer as a semiconductor layer.

It can be crystallized by heating at 650° C. (±50° C.) for 15 min (±1 min) using a rapid heating technique to form a semiconductor layer. Amorphous silicon is formed into polysilicon. The temperature and time of heating can be set according to the actual situation. In this example, the amorphous silicon was crystallized by heating at 650° C. for 15 min by rapid heating. Since the upper surface contained more boron ions, the temperature and the time of crystallization were lowered. And hence the crystal orientation was from the top to the bottom. A conductor material is formed away from the insulating layer and a semiconductor layer close to the insulating layer.

S234: The conductor material is patterned to obtain a conductor layer.

After the patterning treatment of the conductor material, the photoresist material on the conductor layer is not removed, and the process proceeds to step S24.

Figure 6:
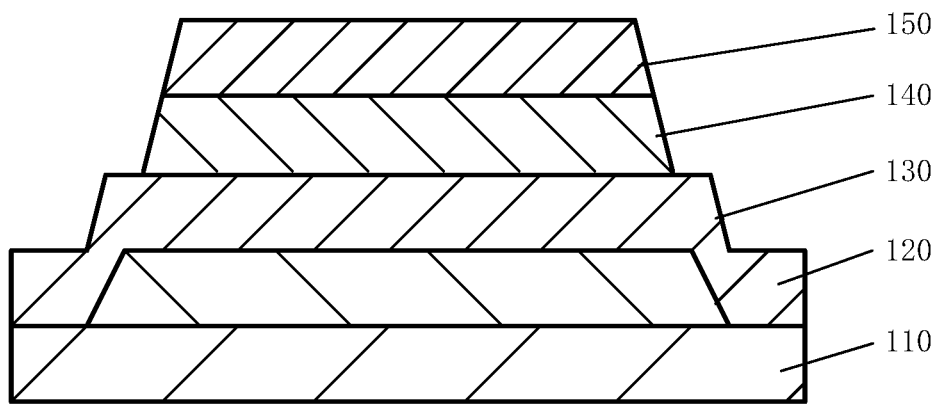
FIG. 6 is a schematic structural view of the substrate after step S232 of the method of manufacturing the thin film transistor shown in FIG. 5.
Figure 7:
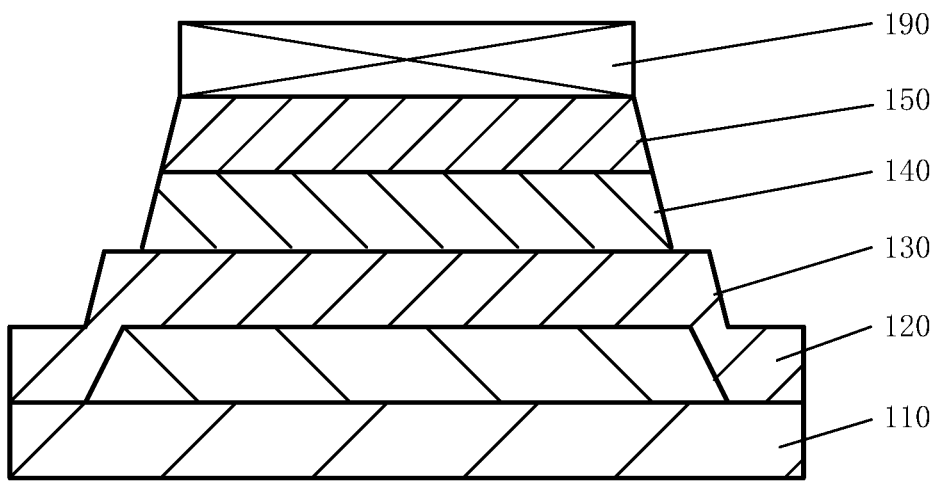
FIG. 7 is a schematic structural view of the substrate after step S234 in the method of manufacturing the thin film transistor shown in FIG. 5.

Combined FIG. 6 and FIG. 7 to understand the above-mentioned steps, FIG. 6 is a schematic view of the method of manufacturing the thin film transistor after the step S232 shown in FIG. 5. FIG. 7 is a method of manufacturing a thin film transistor substrate after S234 in FIG. 7.

FIG. 6 shows the glass substrate 110, the gate layer 120 and the insulating layer 130, a gate layer 120 formed on the substrate 110, the gate insulating layer 130 covers the layer 120, the amorphous silicon layer 140 is formed on the insulating layer 130, a conductive material layer 150 on the amorphous silicon layer 140 is deposited.

FIG. 7 shows a semiconductor layer 140 is formed on the insulating layer 130, a conductor layer 150 is formed on the semiconductor layer 140, and a photoresist material 190 disposed on the conductor layer 150. The same reference numerals described in other portions of FIG. 6.

S24: The semiconductor layer is subjected to a doping process so as to provide conductive spacers on the insulating layer and the side surface of the semiconductor layer.

The implanted dose of boron ions can be set according to the actual requirements, for example, 0.1 ml, 0.5 ml, 1 ml, 3 ml, etc. In the present embodiment, boron ions 1 ml are implanted into the semiconductor layer by ion implantation technique. After removing the conductor layer on the photoresist material, rapid heating technology is used for activation treatment. Heating temperature is 550° C.~590° C., and heating time is 1 to 2 minutes, where the heating temperature and heating time can be set according to the actual situation, for example, heating temperature may be 550° C., 560° C., 570° C., 580° C., or 590° C., and the heating time may be 1 minute, 1 minute 15 seconds, 1 minute and 30 seconds, 1 minute 45 seconds, or 2 minutes. In the present example, the heating temperature was 550° C. and the heating time was 2 minutes. The conductor layer material, i.e., the conductive spacer, was also formed on the sidewalls of the semiconductor layer.

S25: photoresist material is removed.

After forming the conductive spacers, the photoresist material is removed.

S26: A source and drain layer is formed on the conductor layer and the insulating layer.

A combination layer superimposed molybdenum, aluminum and molybdenum is deposited on the conductor layer by means of a physical vapor deposition technique. A source and drain layer is formed by patterning process. Now the source and drain layer is deposited on the conductor layer and the insulating layer. Because the sidewalls of the semiconductor layer have conductive spacers, the source and drain layers are blocked by the conductive spacers without contacting with the semiconductor layer.

Figure 8:
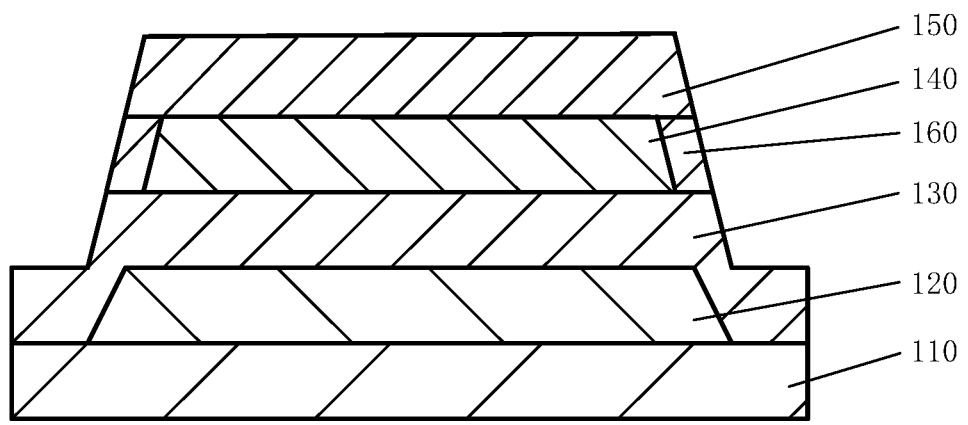
FIG. 8 is a schematic structural view of the substrate after step S25 in the method of manufacturing the thin film transistor shown in FIG. 5.

Conjunction with FIG. 8 to understand the above-mentioned step, FIG. 8 is a schematic structure of manufacturing the thin film transistor method after the step S25 illustrated in FIG. 5.

Shown in FIG. 8, the conductive spacers 160 is provided on the sidewall of the semiconductor layer 140, and is also provided between the conductor layer 150 and the insulating layer 150. The other reference numerals are same as the reference numerals in FIG. 7.

S27: A passivation layer is provided on the insulating layer, the source and drain layer, and the semiconductor layer.

After forming the source and drain layer, the conductor layer is processed to form a channel, the conductor layer on the upper surface of the channel is removed. The semiconductor layer on the lower portion of the channel is left. After forming the channel, a passivation layer is continued to protect the channel. In particular, a source and drain layer is formed to be a metal electrode, which is etched as a mask to form a channel. The conductor layer is removed on the upper surface of the channel, and the lower portion of the channel semiconductor layer is left to obtain a thin film transistor. A passivation material is deposited by using PECVD to pattern the passivation layer. The passivation material may be silicon oxide or other material, and in this embodiment, the passivation material is oxidized silicon. The passivation layer is provided on the insulating layer, the source and drain layer and the semiconductor layer to complete the fabrication of the thin film transistor. Finally, the thin film transistor is finally obtained, as shown in FIG. 1.

Figure 9:
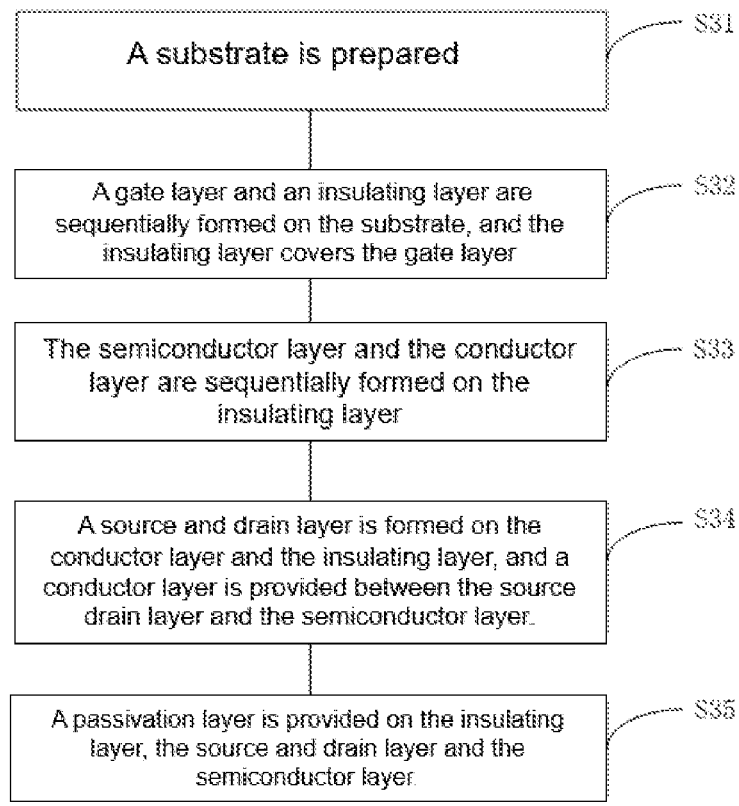
FIG. 9 is a schematic flow diagram of a further embodiment of the method of manufacturing a thin film transistor of the present invention.

Please refer to FIG. 9. FIG. 9 is a schematic flow diagram of manufacturing a thin film transistor according to other embodiments of the present invention. In the present embodiment, a method of manufacturing a thin film transistor may comprise the following steps.

S31: A substrate is prepared.

S32: A gate layer and an insulating layer are sequentially formed on the substrate, and the insulating layer covers the gate layer.

S33: The semiconductor layer and the conductor layer are sequentially formed on the insulating layer.

S34: A source and drain layer is formed on the conductor layer and the insulating layer, and a conductor layer is provided between the source drain layer and the semiconductor layer.

S35: A passivation layer is provided on the insulating layer, the source and drain layer and the semiconductor layer.

The above steps S31-S35 in the present embodiment are similar to the corresponding steps of the above described embodiment, and the same parts will not be described again.

The difference is that in the step S33 of the present embodiment, and the following steps are specifically included.

S331: An amorphous silicon layer is formed on the insulating layer.

S332: The conductor material is deposited on the amorphous silicon layer.

S333: The amorphous silicon layer is subjected to a crystallization treatment to obtain a polysilicon layer as a semiconductor layer.

S334: The conductor material is patterned to obtain a conductor layer.

Figure 10:
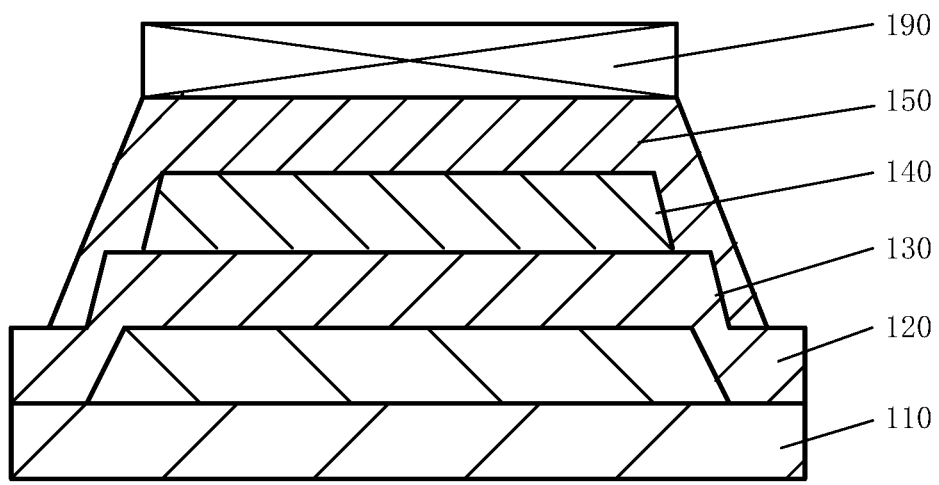
FIG. 10 is a schematic view of the mask etching in step S334 of the manufacturing method of the thin film transistor shown in FIG. 9.

When the conductive material is patterned to S334 process steps, to obtain a conductor layer covering the semiconductor layer, particularly appreciated in conjunction with FIG. 10. FIG. 10 is a schematic diagram of the etching mask of the step S334 of the method for manufacturing a thin film transistor shown in FIG. 9. In the process of etching with a mask, the mask size is large, and the conductor layer region is defined by the mask during the patterning of the conductor material so that the pattern of the conductor layer is slightly larger than the pattern of the semiconductor layer. The conductor layer is covered on the semiconductor layer and the conductor layer is further provided on the insulating layer.

In step S34, a combination layer superimposed from molybdenum, aluminum and molybdenum is deposited on the conductor layer by means of a physical vapor deposition technique. A source and drain layer is formed by patterning process. Now the source and drain layer is deposited on the conductor layer and the insulating layer. Because the sidewalls of the semiconductor layer have conductive spacers, the source and drain layers are blocked by the conductive spacers without contacting with the semiconductor layer.

In step S35, after forming the source and drain layer, the conductor layer is processed to form a channel and the conductor layer on the upper surface of the channel is removed, the semiconductor layer on the lower portion of the channel is left. After forming the channel, a passivation layer is deposited to protect the channel. In particular, the source and drain layer is formed as a metal electrode, and the conductor layer is etched by using the source and drain layer as a mask to form a channel. The conductor layer on the upper surface of the channel is removed, and a lower channel semiconductor layer is left to obtain a thin film transistor, while a passivation material is deposited using PECVD, and patterned to form a passivation layer. The passivation material may be silicon oxide or other material. In this embodiment, the material is silicon oxide. The passivation layer is provided on the insulating layer, the source and drain layer and the semiconductor layer to complete the fabrication of the thin film transistor. The thin film transistor is finally obtained reference to the case shown in FIG. 2.

The thin film transistor of the present embodiment has a preparation substrate. A gate layer and an insulating layer are sequentially formed on the substrate. The insulating layer is covered with the gate layer. The semiconductor layer and the conductor layer are sequentially formed on the insulating layer. A conductor layer or a conductive spacer is provided at both ends of the semiconductor layer. A source and drain layer is formed on the conductor layer and the insulating layer. A passivation layer is provided on the insulating layer, the source and drain layer and the semiconductor layer. Because a conductor layer or a conductive spacer is blocked between the source and drain layer, and the semiconductor layer, the source and drain layer is prevented from being in direct contact with the semiconductor layer. The effect of reducing the leakage current can be improved and the characteristics of the thin film transistor can be improved.

Figure 11:
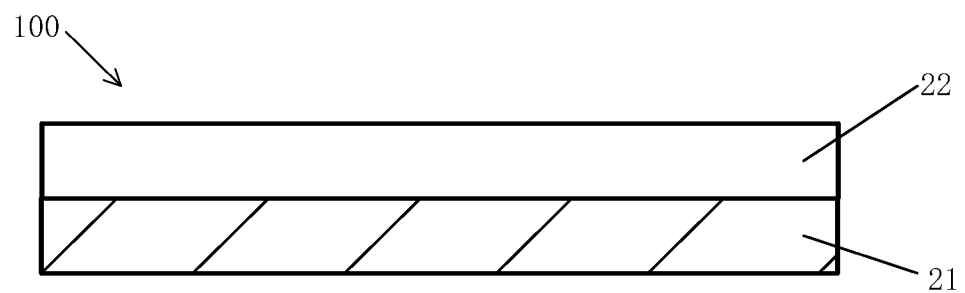
FIG. 11 is a schematic structural diagram of the embodiment of the liquid crystal display panel of the present invention.

Refer to FIG. 11. FIG. 11 is a schematic structural view of an embodiment of the liquid crystal display panel of the present invention. The liquid crystal display panel 200 of the present embodiment includes a thin film transistor 21, and the thin film transistor 21 is similar to the thin film transistor 100 described above, and will not be described in detail.

In addition, the liquid crystal display panel 200 further includes the liquid crystal display layer 22 for realizing the display.

In the present embodiment, there is no direct contact between the drain and source layer and the semiconductor layer of the thin film transistor in the liquid crystal display panel. The leakage current between the thin film transistor is reduced, thereby the performance of the thin film transistor is improved and the display performance of the liquid crystal display panel is improved.

The embodiments described above are only embodiments of the present invention, not intended to limit the scope of the present invention, all utilize the present specification and drawings taken equivalent structures or equivalent process, or other direct or indirect application Related technical fields shall fall within the scope of protection of the present invention.

What is claimed is:

1. A liquid crystal display panel comprising a thin film transistor, wherein the thin film transistor comprises:
 a substrate;
 a gate layer disposed on the substrate;
 an insulating layer covering the gate layer;
 a semiconductor layer disposed on the insulating layer;
 a conductor layer disposed on the semiconductor layer;
 the semiconductor layer having a channel region, the channel region dividing the semiconductor layer into left and right portions, the conductor layer being formed on the left and right portions of the semiconductor layer to form a two-island structure;
 a source and drain layer provided on the conductor layer and the insulating layer, and the conductor layer is provided between the source and drain layer and the semiconductor layer;
 a conductive spacer disposed on a side surface of the semiconductor layer, wherein the conductive spacer is located at a layer same to the semiconductor layer, and between the semiconductor layer and the source and drain layer, such that the semiconductor layer is not directly contacted with the source and drain layer since the conductor layer and the conductive spacer are between the semiconductor layer and the source and drain layer; and
 a passivation layer provided on the insulating layer, the source and drain layer and the semiconductor layer;

wherein the gate layer and the source and drain layer are metallic materials;

the insulating layer and the passivation layer are insulating materials.

2. The liquid crystal display panel according to claim 1, wherein material of the conductive spacer is the same as material of the conductor layer.

3. The liquid crystal display panel according to claim 1, wherein the semiconductor layer comprises a polysilicon layer; the conductor layer comprising a P-type conductor layer or an N-type conductor layer; the source and drain layer comprises a combination layer superimposing molybdenum, aluminum and molybdenum metal in order.

4. A thin film transistor, wherein the thin film transistor comprises:
- a substrate;
- a gate layer disposed on the substrate;
- an insulating layer covering the gate layer;
- a semiconductor layer disposed on the insulating layer;
- a conductor layer disposed on the semiconductor layer;
- the semiconductor layer having a channel region, the channel region dividing the semiconductor layer into left and right portions, the conductor layer being formed on the left and right portions of the semiconductor layer to form a two-island structure;
- a source and drain layer disposed on the conductor layer and the insulating layer, and a conductor layer is provided between the source and drain layer and the semiconductor layer;
- a conductive spacer disposed on a side surface of the semiconductor layer, wherein the conductive spacer is located at a layer same to the semiconductor layer, and between the semiconductor layer and the source and drain layer, such that the semiconductor layer is not directly contacted with the source and drain layer since the conductor layer and the conductive spacer are between the semiconductor layer and the source and drain layer; and
- a passivation layer provided on the insulating layer, the source and drain layer, and the semiconductor layer;

wherein the gate layer and the source and drain layer are metallic materials;

the insulating layer and the passivation layer are insulating materials.

5. The thin film transistor according to claim 4, wherein material of the conductive spacer is the same as material of the conductor layer.

6. The thin film transistor according to claim 4, wherein the semiconductor layer comprises a polysilicon layer, the conductor layer comprising a P-type conductor layer or an N-type conductor layer, the source and drain layer comprises a combination layer superposing a molybdenum, aluminum, and molybdenum in order.

* * * * *